United States Patent
Ono

(10) Patent No.: US 10,896,841 B2
(45) Date of Patent: Jan. 19, 2021

(54) FILM FORMATION APPARATUS

(71) Applicant: SHIBAURA MECHATRONICS CORPORATION, Yokohama (JP)

(72) Inventor: Daisuke Ono, Yokohama (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 98 days.

(21) Appl. No.: 16/143,927

(22) Filed: Sep. 27, 2018

(65) Prior Publication Data

US 2019/0103300 A1 Apr. 4, 2019

(30) Foreign Application Priority Data

Sep. 29, 2017 (JP) .................................. 2017-190935

(51) Int. Cl.
*C23C 14/34* (2006.01)
*H01L 21/687* (2006.01)
(Continued)

(52) U.S. Cl.
CPC .... *H01L 21/68714* (2013.01); *C23C 14/0042* (2013.01); *C23C 14/0078* (2013.01);
(Continued)

(58) Field of Classification Search
CPC ....................... C23C 14/0042; H01J 37/32816
See application file for complete search history.

(56) References Cited

U.S. PATENT DOCUMENTS

| 8,758,580 B2 * | 6/2014 | DeVito | C23C 14/042 |
| | | | 204/298.15 |
| 2002/0003086 A1 * | 1/2002 | Sferlazzo | C23C 14/044 |
| | | | 204/298.11 |

(Continued)

FOREIGN PATENT DOCUMENTS

| JP | 2004-285392 A | 10/2004 |
| JP | 4416422 B2 | 2/2010 |

(Continued)

*Primary Examiner* — Jason Berman
(74) *Attorney, Agent, or Firm* — Nath, Goldberg & Meyer; Jerald L. Meyer

(57) ABSTRACT

A film formation apparatus includes a film formation unit which includes a film formation room having an opening at one end, has a target formed of a film formation material in the film formation room, and deposits the film formation material of the target on a surface of a workpiece facing the opening by plasma produced by a sputter gas in the film formation room, and a carrier that carries the workpiece along a predetermined carrying path so that the workpiece repeatedly pass through a facing region which faces the opening of the film formation room and a non-facing region which does not face the opening of the film formation room. The carrier includes a low-pressure position where the workpiece is placed and which causes an interior of the film formation room to be lower than a plasma ignition lower limit pressure and to be equal to or higher than a plasma electric discharge maintaining lower limit pressure when passing through the facing region, and a high-pressure position where workpiece is not placed and which causes the interior of the film formation room to be equal to or higher than the plasma ignition lower limit pressure when passing through the facing region.

9 Claims, 14 Drawing Sheets

(51) Int. Cl.
  *H01J 37/32* (2006.01)
  *C23C 14/00* (2006.01)
  *C23C 14/56* (2006.01)
  *C23C 14/08* (2006.01)
  *C23C 14/50* (2006.01)

(52) U.S. Cl.
  CPC ............ *C23C 14/083* (2013.01); *C23C 14/34* (2013.01); *C23C 14/505* (2013.01); *C23C 14/568* (2013.01); *H01J 37/32449* (2013.01); *H01J 37/32816* (2013.01); *H01L 21/68764* (2013.01); *H01L 21/68771* (2013.01)

(56) References Cited

U.S. PATENT DOCUMENTS

2012/0152736 A1* 6/2012 Yamaguchi ......... C23C 14/0063
                                                        204/298.07
2015/0097485 A1   4/2015 Vane

FOREIGN PATENT DOCUMENTS

JP   2016-69727 A    5/2016
TW   201612346 A     4/2016

* cited by examiner

FILM FORMATION APPARATUS

CROSS-REFERENCE TO RELATED APPLICATION

This application is based upon and claims the benefit of priority from Japan Patent Application No. 2017-190935, filed on Sep. 29, 2017, the entire contents of which are incorporated herein by reference.

FIELD OF THE INVENTION

The present disclosure relates to a film formation apparatus.

BACKGROUND

In the manufacturing of various products, such as a semiconductor apparatus, a liquid crystal display, and an optical disk, a thin film is formed on a workpiece, such as a wafer or a glass substrate. The thin film is formed by, for example, a film formation of forming a metal film, etc., on the workpiece, and a film processing such as etching, oxidization, or nitridation of the formed film.

As for an apparatus to perform such film formation, a film formation apparatus that forms a film by sputtering using plasma has been proposed. This film formation apparatus introduces an inert gas into a vacuum container in which a target is installed, and applies a DC voltage to the target. This causes the ions of the plasma inert gas to bombard to the target of a film formation material, and the material beaten out from the target is deposited on the workpiece to form a film.

Moreover, there is a film formation apparatus which has a rotation table installed in one vacuum container, and which also has a plurality of film formation units that form films installed in the upper circumferential direction of the rotation table to sequentially perform film formation. The workpiece is held on the rotation table, and is circulated and carried to repeatedly pass through the location right under the film formation units, thereby efficiently performing a film formation.

In this case, as for the film formation by the film formation apparatus, a film that has a plurality of laminated layers of $TiO_2$ and $SiO_2$, etc., may be formed. The film that has the laminated $TiO_2$ and $SiO_2$ is utilized as an antireflection film and a reflection increasing film that utilize optical interference. There is a desire for the antireflection film and the reflection increasing film to enhance the denseness of the film to improve the visibility.

In film formation by sputtering, Japan Patent No. 4416422 discloses a technology to increase the denseness of a film. Japan Patent No. 4416422 discloses to increase the pressure around the target to be relatively high like 0.01 Pa to maintain the pressure required for electric discharge to produce plasma, while reducing the pressure near a substrate that is a workpiece. When the pressure is low, the number of bombardment of sputter particles, that are film formation materials beaten out from the target, to gas molecules until reaching the workpiece decreases. Accordingly, the sputter particles do not lose the energy and a change in direction is suppressed. Since the sputter particles having high energy and reached the workpiece can move on the surface of the workpiece, the sputter particles move to a non-dense portion of the thin film. Accordingly, a dense film is formed.

In contrast, when the distance between the target and the workpiece is large, the energy of the sputter particles is attenuated, and a change in direction is likely to occur. Hence, in order to improve the denseness of the film, it is preferable that the distance between the target and the workpiece is small. However, as described above, it is necessary to increase the pressure near the target to be relatively high. Accordingly, when the target becomes close to the workpiece, it becomes difficult to reduce the pressure near the workpiece. That is, the pressure level near the workpiece that can be reduced has a limit.

Moreover, in the case of the above-described circulating and carrying film formation apparatus, the film formation unit and the rotation table are placed in the chamber. Accordingly, increasing the distance between the target in the film formation unit and the workpiece on the table increases the entire size of the apparatus. Hence, the distance between the target and the workpiece becomes relatively small, making it difficult to provide a pressure difference between the proximity of the target and that of the workpiece. Moreover, according to Japan Patent No. 4416422, a gas supply unit that supplies the sputter gas to the proximity of the target, a nozzle-shape member that surrounds the target, and a gas discharging unit that discharges the gas near the workpiece are provided. However, it is difficult to add such structures to each of the film formation units which face the rotation table.

Furthermore, when the target is too close to the workpiece, a problem in thickness distribution, such as locally thick film, occurs. In particular, when sputtering is simultaneously executed on the plurality of targets to form a film, a film thickness peak occurs at the position corresponding to each target, and the film thickness between the targets becomes thin, decreasing the uniformity in film thickness distribution.

Still further, there is a technology of applying a bias voltage to the workpiece to execute sputtering, to improve the denseness of a film. However, addition of a structure that applies a voltage to the workpiece circulated and carried by the rotation table makes the structure of the film formation apparatus quite complicated. Yet still further, there is a technology of increasing the voltage applied to the target to improve the denseness of a film. However, when the applied voltage is increased without, the target may be damaged.

The present disclosure has been made in order to address the above-described technical problems, and an objective is to provide a film formation apparatus capable of decreasing the pressure near a moving workpiece, and improve the denseness of a film.

SUMMARY OF THE INVENTION

In order to accomplish the above objective, a film formation apparatus according to the present disclosure includes:
 a film formation unit that includes a film formation room having an opening at one end, has a target formed of a film formation material in the film formation room, and deposits the film formation material of the target on a surface of a workpiece facing the opening by plasma produced by a sputter gas in the film formation room; and
 a carrier that carries the workpiece along a predetermined carrying path so that the workpiece repeatedly passes through a facing region which faces the opening of the film formation room and a non-facing region which does not face the opening of the film formation room,
 in which the carrier includes:
 a low-pressure position where the workpiece is placed and which causes an interior of the film formation room to be lower than a plasma ignition lower limit pressure and to be equal to or higher than a plasma electric discharge maintaining lower limit pressure when passing through the facing region; and a high-pressure position where the workpiece is not placed and which causes the interior of the film formation room to be equal to or higher than the plasma ignition lower limit pressure when passing through the facing region.

A distance between a facing surface of the low-pressure position facing the opening and the target may be longer than a distance between a facing surface of the high-pressure position facing the opening and the target.

A distance of the low-pressure position in a direction along the carrying path and a distance of the high-pressure position in the direction along the carrying path may be respectively equal to or longer than a distance of the opening in the direction along the carrying path.

The low-pressure position may include a recess on which the workpiece is placed. A conductance between the low-pressure position and the opening may be greater than a conductance between the high-pressure position and the opening.

The carrier may be a rotation table that circulates and carries the workpiece on a circumferential trajectory. The opening and the low-pressure position may each be in a substantially sector shape.

The film formation apparatus may further include a film processing unit that combines a substance with the film formed on the workpiece by the film formation unit at a region where the low-pressure position and the high-pressure position face to perform a process of producing a compound film, and the conductance between the low-pressure position and the opening may exceed 1.0 time and is equal to or smaller than 10.0 times relative to the conductance between the high-pressure position and the opening.

When an internal pressure of the film formation room when the low-pressure position passes through the facing region is P1, a distance between the facing surface of the low-pressure position facing the opening and the target is H1, the internal pressure of the film formation room when the high-pressure position passes through the facing region is P2, and a distance between the facing surface of the high-pressure position facing the opening and the target is H2, $P1 \times H1 \leq P2 \times H2$ may be satisfied.

A distance between the facing surface of the low-pressure position facing the opening and the target may be designed as changeable.

The workpiece may be placed on the low-pressure position via single or a plurality of trays.

The film formation apparatus may further include a gas supply unit that supplies the sputter gas in the film formation room so that an internal pressure of the film formation room becomes equal to or higher than a plasma electric discharge maintaining lower limit pressure and lower than a plasma ignition lower limit pressure when the low-pressure position passes through the facing region, and the internal pressure of the film formation room becomes equal to or higher than the ignition lower limit pressure when the high-pressure position passes through the facing region.

According to the present disclosure, a film formation apparatus which can decrease the pressure near a moving workpiece, and improve the denseness of a film is provided.

DETAILED DESCRIPTION OF THE EMBODIMENTS

Figure 1:
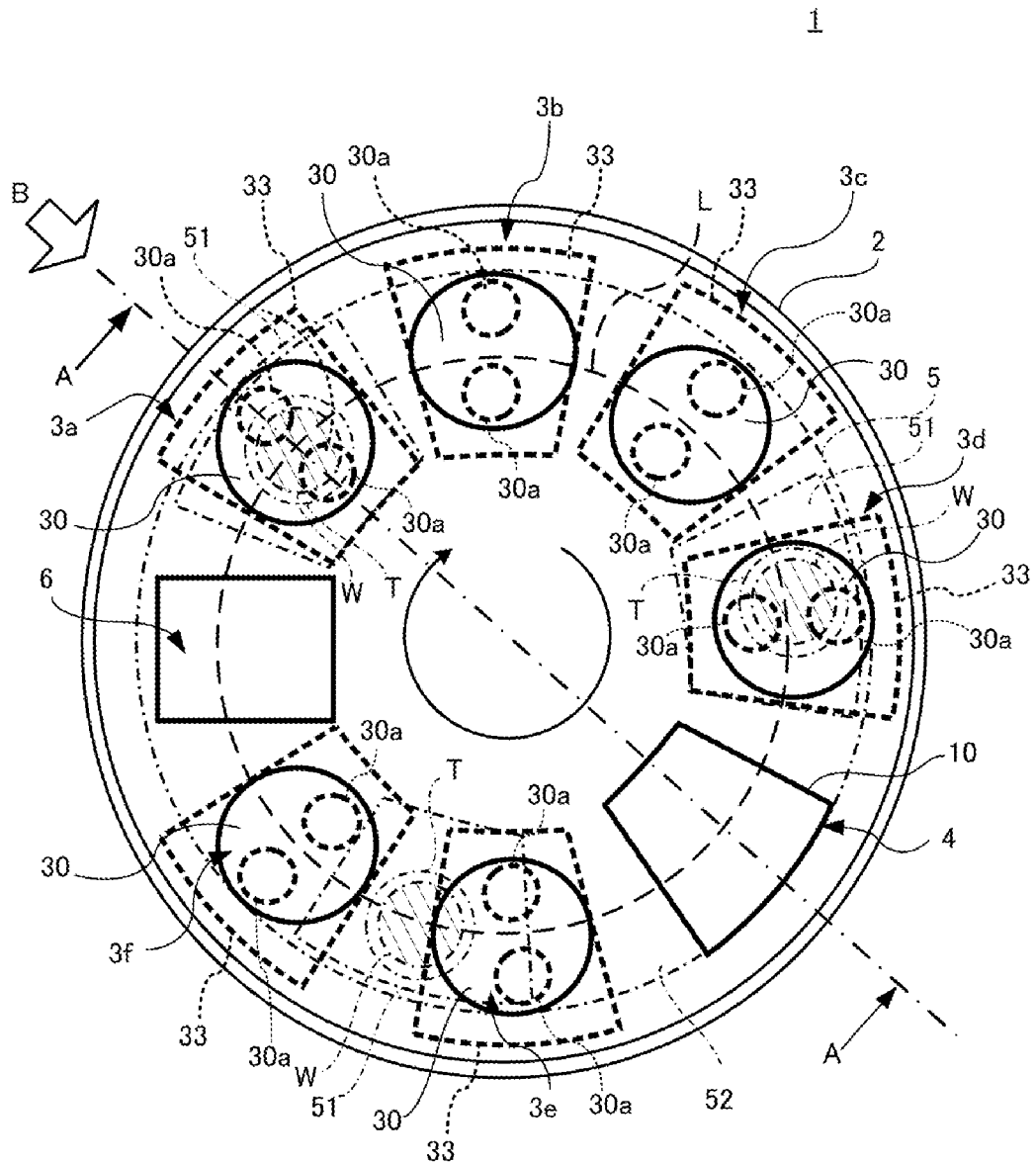
FIG. 1 is a plan view schematically illustrating an example structure of a film formation apparatus according to an embodiment of the present disclosure.
Figure 2:
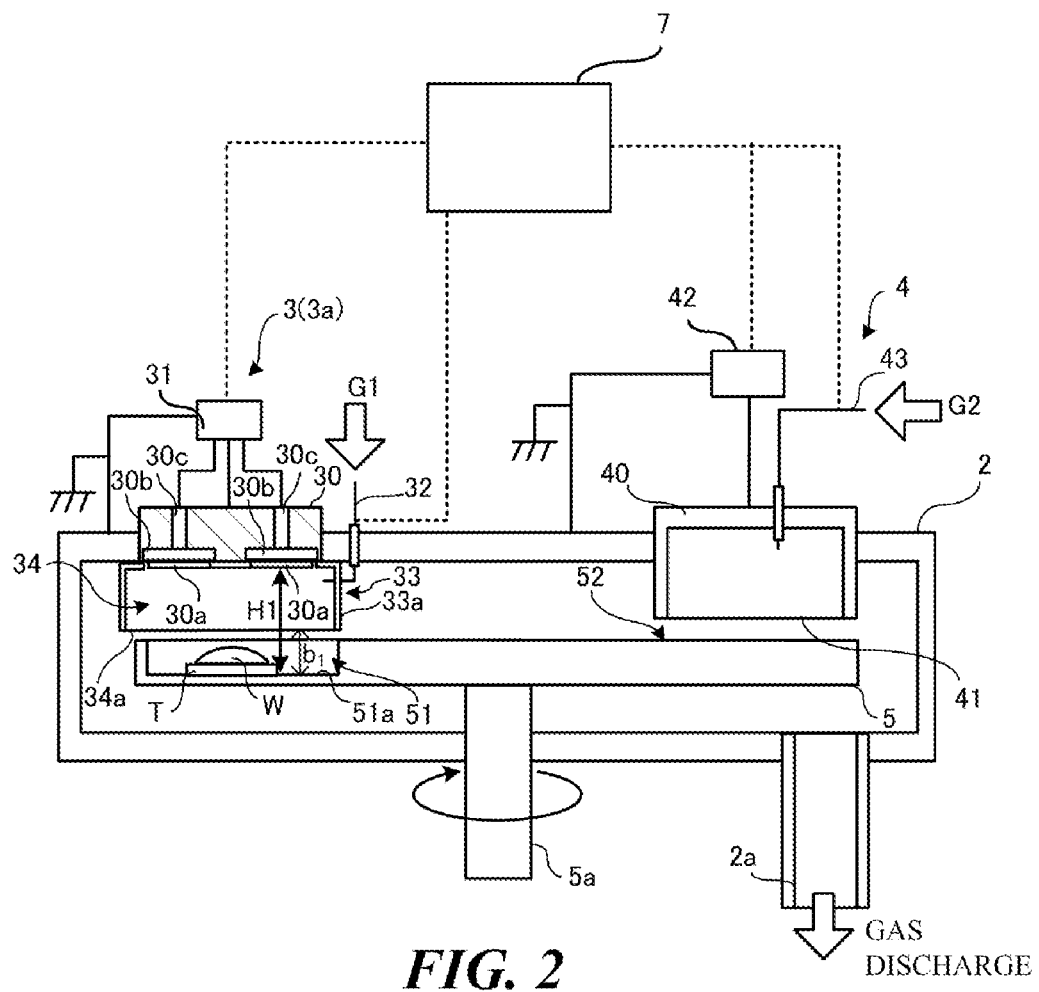
FIG. 2 is a cross-sectional view taken along a line A-A in FIG. 1.

A film formation apparatus according to this embodiment will be described with reference to the figures. FIG. 1 is a simplified plan view of a film formation apparatus 1, and FIG. 2 is a cross-sectional view taken along a line an A-A in FIG. 1.

[Outline]

The film formation apparatus 1 according to this embodiment includes a chamber 2, film formation units 3a to 3f, a film process unit 4, and a carrier 5 as illustrated in FIG. 1. The chamber 2 is a container that has an interior capable of being vacuumed. As illustrated in FIG. 2, the film formation units 3a to 3f each have a film formation room 34 that has an opening 34a at one end, and also have a target 30a formed of a film formation material in the film formation room 34. The film formation units 3a to 3f are each a structure which deposits the film formation material of the target 30a on the surface of a workpiece W that faces the opening 34a to form a film by plasma produced by a sputter gas G1 in the film formation room 34.

In this embodiment, as will be described later, the film formation room 34 is a space formed in the interior of a shielding member 33 provided in the chamber 2. The shielding member 33 has an opening 24a at the side opposite to the ceiling of the chamber 2. That is, although the film formation room 34 and the opening 34a are formed by the shielding member 33, according to the present disclosure, for simplification of explanation, it is described as the opening 34a of the film formation room 34. Although a wafer, a glass substrate, an electronic component, etc., are applicable as the workpiece W processed in the film formation apparatus 1, all kinds of other components that need a film formation on the surface are applicable. Moreover, the workpiece W may be in a tabular shape, in a curved shape, or have concavities and convexities. In this embodiment, as illustrated in FIGS. 1 and 2, the workpiece W with a curved surface is applied.

The film process unit 4 is a structure that performs film processing on the film formed on the workpiece W in the film formation units 3a to 3f. The film processing involves production of compound films, such as an oxide film or a nitride film, etc. by a post-oxidization process, etc., surface reformation, such as etching and ashing, and cleaning, etc. The post-oxidation process is a process of oxidizing a metal or semiconductor film by reacting oxygen ions, etc., produced by plasma with the metal or semiconductor film formed by the film formation unit 3.

The carrier 5 is a structure that carries the workpiece W along a predetermined carrying path L to repeatedly pass through a facing region which faces the opening 34a of the film formation room 34 and a non-facing region that does not face the opening 34a of the film formation room 34. The facing region is apart from the opening 34a and overlaps the opening 34a in a planar view, while the non-facing region is apart from the opening 34a and does not overlap the opening 34a in a planar view. In this embodiment, the region right below the opening 34a is the facing region.

As illustrated in FIG. 1, the plurality of film formation units 3a, 3b, 3c, 3d, 3e, and 3f, and the film process unit 4 are installed along the carrying path L of the workpiece W formed on the carrier 5 so as to be adjacent with each other with a predetermined gap therebetween. Respective process is performed when the workpiece W passes through under the film formation unit 3 and the film process unit 4. Note that when the film formation units 3a, 3b, 3c, 3d, 3e, and 3f are not distinguished from each other, it will be referred to as the film formation unit 3.

[Structure]

A structure of the above-described film formation apparatus 1 will be described below in detail.

(Chamber)

As illustrated in FIGS. 1 and 2, the chamber 2 is a sealed container in a substantially cylindrical shape. The chamber 2 is provided with a gas discharging unit 2a connected to a depressurizing device such as an unillustrated pump, and the interior of the chamber 2 can be vacuumed by the discharging of the gas discharging unit 2a.

(Film Formation Unit)

As illustrated in FIG. 2, the film formation unit 3 includes a sputter source 30, a DC power supply 31, a sputter gas introducing unit 32, and the shielding member 33. The sputter source 30 includes the target 30a, a backing plate 30b, and an electrode 30c. The target 30a is a tabular member formed of a film formation material which is to be deposited on the workpiece W and which forms a film. The target 30a is installed at the position that faces the workpiece W when the workpiece W passes through under the film formation room 34. As illustrated in FIG. 1, two cylindrical targets 30a are provided according to this embodiment. However, the number of the targets 30a is not limited to this number. The single target 30a or equal to or greater than three targets 30a may be provided.

The backing plate 30b holds the target 30a. The electrode 30c is a conductive member to apply electric power to the target 30a from the exterior of the chamber 2. The sputter source 30 may be provided with a magnet, a cooling structure, etc., as appropriate.

The DC power supply 31 applies a DC voltage to the target 30a via the electrode 30c. As for the power supply, conventionally well-known power supplies, such as a DC pulse power supply, an RF power supply, etc., are applicable. The sputter gas introducing unit 32 is a gas supplying portion that introduces the sputter gas G1 in the film formation room 34 from the location near to the location on the upper surface of the chamber 2 where the target 30a is attached. Inert gas, such as argon (Ar), is applicable as the sputter gas G1.

As illustrated in FIGS. 1 and 2, the shielding member 33 is in a substantially sector box shape in a plan view. The interior of the shielding member 33 is the film formation room 34, and the lower portion thereof is the opening 34a directed toward the carrier 5. An outer circumference wall of the shielding member 33 serves as a dividing wall 33a that reduces the leakage of the plasma from the surroundings of the target 30a. In the ceiling of the shielding member 33, a hole in the same size and shape as those of the target 30a is formed at the position corresponding to each target 30a to expose the target 30a in the film formation room 34.

The film formation room 34 is a region where the majority of film formation is performed. However, there is a slight leakage of the film formation material from the film formation room 34 at the region outside the film formation room 34. Therefore, there is a slight deposition of the film formation material. That is, a film formation region where film formation is performed by the film formation unit 3 is a region slightly larger than the film formation room 34 defined by the shielding member 33. Therefore, although the facing region is subjected to the film formation, a deposition of the film formation material may occur even at the non-facing region.

(Film Process Unit)

As illustrated in FIGS. 1 and 2, the film process unit 4 includes a box-shape electrode 40 installed on the upper surface of the chamber 2. Although the shape of the electrode 40 is not limited to any particular shape, according to this embodiment, the electrode 40 is formed in a substantially sector shape in a planar view. The electrode 40 has an opening 41 at the bottom. The outer edge of the opening 41, that is, the lower end of the electrode 40 faces the upper surface of the carrier 5 with a slight gap.

An RF power supply 42 to apply a high-frequency voltage is connected to the electrode 40. An unillustrated matching box is connected to the output side of the RF power supply 42. The RF power supply 42 is also connected to the chamber 2, and the electrode 40 serves as a cathode while the chamber 2 serves as an anode. Moreover, a process gas introducing unit 43 is connected to the electrode 40, and a process gas G2 is introduced to the electrode 40 from an external process gas supply source via the process gas introducing unit 43.

The process gas G2 can be changed as appropriate in accordance with the purpose of the film processing. For example, when etching is performed, inert gas such as argon is applied as an etching gas. When oxidation is performed, oxygen is applied. When nitridation is performed, nitrogen is applied. Plasma is produced in the electrode 40 by introducing the process gas G2 to the electrode 40 via the process gas introducing unit 43, and applying a high-frequency voltage by the RF power supply 42. The installation sequence and number of the film formation units 3 and the film process unit 4 are not particularly limited.

(Carrier)

Figure 3:
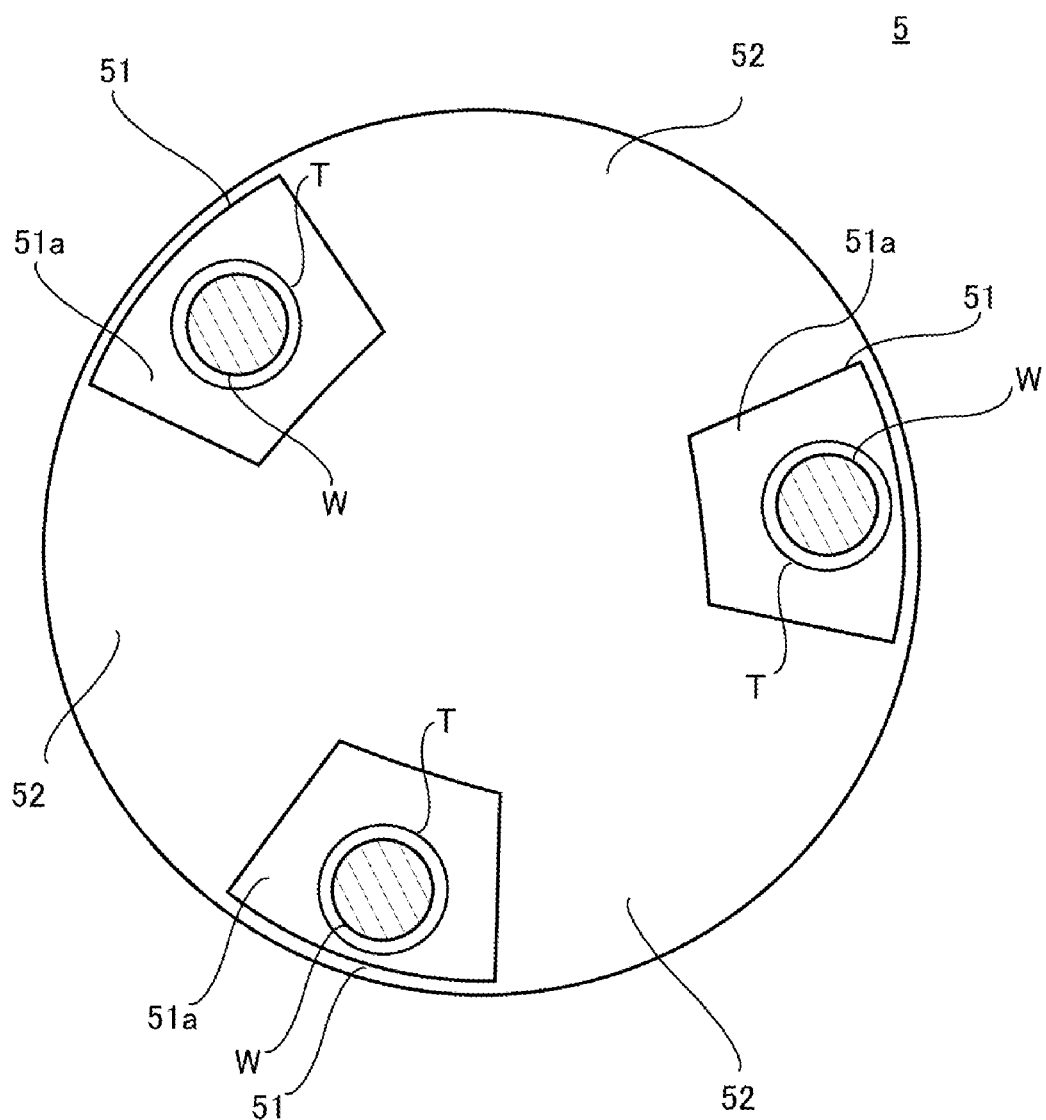
FIG. 3 is a plan view schematically illustrating a carrier of the embodiment.

As illustrated in FIG. 1 and a plan view that is FIG. 3, the carrier 5 is a rotation table in a circular disc shape provided in the chamber 2. A center shaft 5*a* (see FIG. 2) of the carrier 5 is coupled to an unillustrated drive mechanism. By the drive force of the drive mechanism, the carrier 5 rotates with the center shaft 5*a* as a rotation axis. The carrier 5 and the drive mechanism forms a carrying unit.

The carrier 5 has a low-pressure position 51 and a high-pressure position 52. The low-pressure position 51 is a position which the workpiece W is placed and has the interior of the film formation room 34 less than the plasma ignition lower limit pressure and equal to or greater than the electric discharge maintaining lower limit pressure when passing through the facing position. The plasma ignition lower limit pressure is a lower limit pressure at which the plasma can be ignited when a voltage is applied to the interior of the film formation room 34 to produce (hereinafter, also referred to as ignite) plasma.

The plasma electric discharge maintaining lower limit pressure is a lower limit pressure which can maintain the ignited plasma. The plasma ignition lower limit pressure is higher than the plasma electric discharge maintaining lower limit pressure. Even if the pressure is lower than the ignition lower limit pressure, a film formation is enabled as long as the produced plasma is maintained. As described above, by performing film formation at a low pressure that is lower than the plasma ignition lower limit pressure, the denseness of a film can be improved. Note that the expression "when passing through" means any time point during a time period at which the position passes through. Moreover, according to this embodiment, the workpiece W is placed on the low-pressure position 51 via a tray T. The workpiece W may be directly placed on the low-pressure position 51 or may be indirectly placed thereon via the tray T.

When the carrier 5 rotates, the workpiece W placed on the low-pressure position 51 moves in the circumference direction of the carrier 5. That is, as illustrated in FIG. 1, the carrying path L for the workpiece W is formed in a circular shape on the carrier 5. The workpiece W is subjected to a film formation when passing through under the film formation unit 3, and is subjected to a film processing when passing through under the film process unit 4. In the following description, when the term "circumference direction" is simply used, this means the "circumference direction of the carrier 5", and when the term the "radial direction" is simply used, this means the "radial direction of the carrier 5". Moreover, in this embodiment, as illustrated in FIG. 1, the carrying direction of the workpiece W is clockwise in a planar view, but this is merely an example and may be counterclockwise.

The high-pressure position 52 is a position which workpiece W is not placed and has the interior of the film formation room 34 equal to or higher than the plasma ignition lower limit pressure when passing through the facing region. By setting the pressure to be lower than the plasma ignition lower limit pressure, the plasma once produced may be dissipated, and in this case, it is necessary to increase the internal pressure of the film formation room 34 to be equal to or higher than the plasma ignition lower limit pressure. In this embodiment, the interior of the film formation room 34 that is set to be lower than the plasma ignition lower limit pressure at the low-pressure position 51 can be increased to be equal to or higher than the plasma ignition lower limit pressure by the high-pressure position 52.

Figure 4:
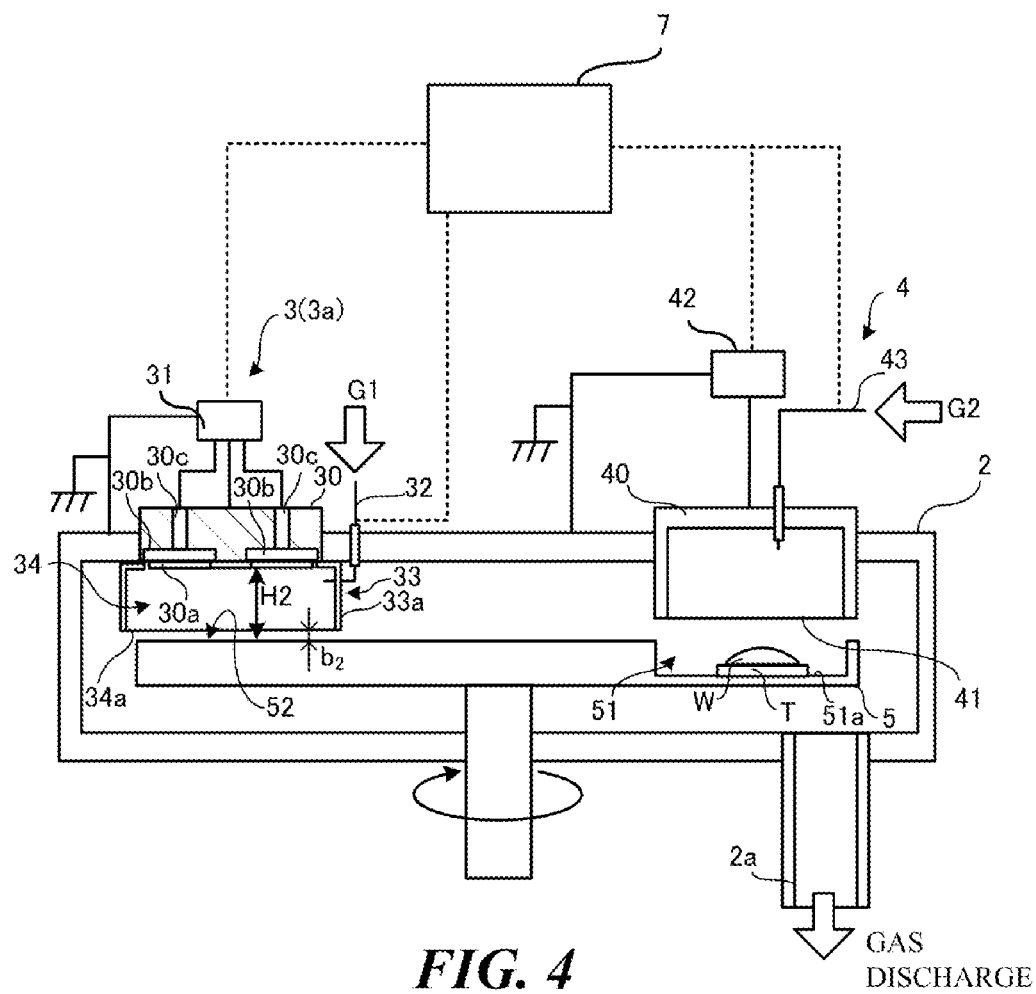
FIG. 4 is a cross-sectional view illustrating a state in which a high-pressure position in FIG. 2 comes to a position facing a film formation unit.

Hence, more specifically, the low-pressure position 51 and the high-pressure position 52 employ the following structure. First, as illustrated in FIGS. 2 and 4, a distance H1 between a facing surface which faces the opening 34*a* of the low-pressure position 51 and the target 30*a* is longer than a distance H2 between a facing surface which faces the opening 34*a* of the high-pressure position 52 and the target 30*a*. That is, as illustrated in FIG. 2, the low-pressure position 51 includes a recess 51*a* on which the workpiece W is placed. Accordingly, the distance between the low-pressure position 51 and the target 30*a* becomes longer than the height of the upper surface of the carrier 5 that is the distance between the high-pressure position 52 and the target 30*a*. The recess 51*a* is a concavity formed in the upper surface of the carrier 5.

In this case, the pressure of the interior of the film formation room 34 when the low-pressure position 51 passes through the facing region is P1 and the pressure of the interior of the film formation room 34 when the high-pressure position 52 passes through the facing region is P2. Accordingly, it is preferable to satisfy a condition $P1 \times H1 \leq P2 \times H2$. The reason will be described below. As described above, as for the scheme to dense the film, there is a scheme of lowering the pressure and a scheme of causing the workpiece W to come close. Since the scheme of causing the workpiece W to come close has a technical problem in the film uniformity, a film formation is performed at a low pressure with the workpiece being apart from the target to some level. However, when the workpiece is too far, the advantage of film formation at a low pressure is reduced.

Although the low-pressure position 51 can be in various shapes in accordance with the shape of the workpiece W, as illustrated in plan views that are FIG. 3 and FIG. 5, in this embodiment, a description will be given of an example case in which the recess 51*a* is in a substantially sector shape in a plan view. The internal bottom surface of the recess 51*a* is a flat facing surface which faces the opening 34*a* (see FIG. 2). The plurality of recesses 51*a* is formed in the upper surface of the carrier 5 at an equal pitch in the circumference direction of the carrier 5. In this embodiment, although the three recesses 51*a* are formed, the present disclosure is not limited to this case. That is, it is appropriate if at least one low-pressure position 51 is formed.

On the upper surface of the carrier 5, portions other than the low-pressure positions 51 are the high-pressure positions 52. That is, the high-pressure position 52 is formed at a flat facing surface where no recess 51*a* is formed.

Figure 5:
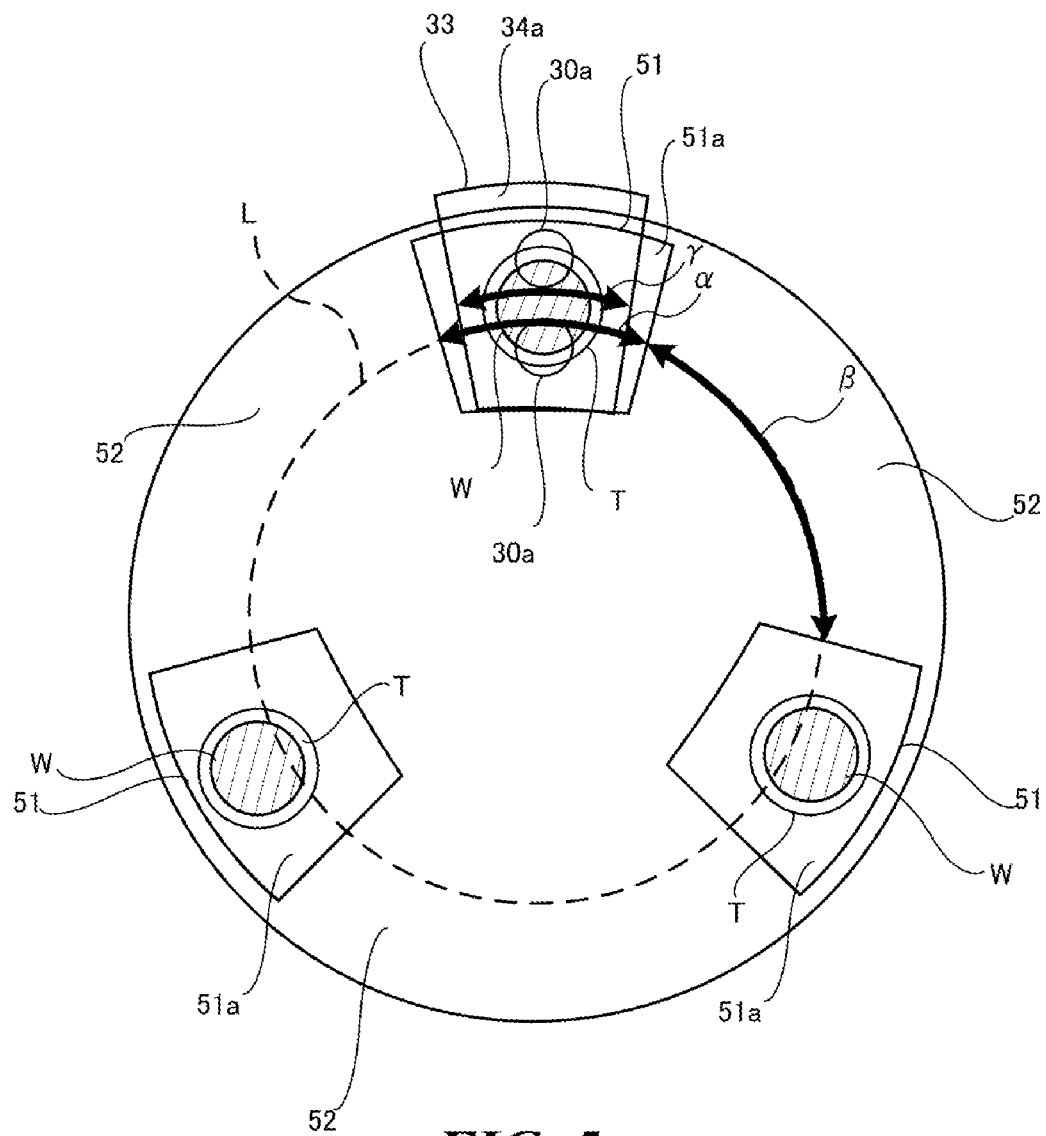
FIG. 5 is an explanatory diagram illustrating a length along a carrying path through a low-pressure position of the carrier, the high-pressure position thereof, and the opening of a film formation room.

Moreover, as illustrated in FIG. 5, a distance α of the low-pressure position 51 along the carrying path L and a distance β of the high-pressure position 52 along the carrying path L are equal to or longer than a distance γ of the opening 34*a* along the carrying path L. This increases a conductance between the low-pressure position 51 and the opening 34*a* to be greater than a conductance between the high-pressure position 52 and the opening 34*a*. That is, since the gap between the low-pressure position 51 and the opening 34*a* at the time of film formation increases, the sputter gas G1 is likely to leak out, and the film formation room 34 becomes low pressure. Since the gap between the high-pressure position 52 and the opening 34*a* decreases when a film formation is not performed, the sputter gas G1 is not likely to leak out, and the film formation room 34 is maintained in high pressure. Note that the wording "at the time of film formation" is a time at which the low-pressure position 51 passes through the facing region with a voltage being applied to the target 30*a*. The wording "when a film formation is not performed" is a time at which the high-pressure position 52 passes through the facing region with a voltage being applied to the target 30*a*.

In addition, as illustrated in FIG. 1, a load-lock unit 6 is provided between the film formation unit 3*a* and the film formation unit 3*f*. The load-lock unit 6 carries the unprocessed workpiece W into the interior of the chamber 2 from the exterior, and carries out the processed workpiece W to the exterior of the chamber 2.

The film formation apparatus 1 further includes a control unit 7. The control unit 7 is constructed by a computer that includes an arithmetic processing unit like a CPU, and a storing unit such as a memory. The control unit 7 performs a control on the introduction and the discharge of the sputter gas G1 relative to the chamber 2 and the process gas G2 relative to the electrode 40, the control on the DC power supply 31 and the RF power supply 42, and the control on the rotating speed of the carrier 5.

[Operation]

An operation of the film formation apparatus 1 according to this embodiment will be described. The following operation is for an example case in which a film of niobium (Nb) is formed by the film formation unit 3*a* to 3*f*, and a post-oxidation process is performed by the film process unit 4 to form niobium oxide ($Nb_2O_x$).

(Outline of Film Formation Process)

First, the interior of the chamber 2 is discharged by the gas discharging unit 2*a*, and is caused to be in the vacuumed condition. The unprocessed workpiece W placed on the tray T is carried into the chamber 2 from the load-lock unit 6 while maintaining the vacuumed condition of the interior of the chamber 2. The carried-in tray T is mounted on the low-pressure position 51 of the carrier 5 positioned in sequence by the load-lock unit 6. Moreover, the carrier 5 is continuously rotated to circulate and carry the workpiece W along the carrying path L. Accordingly, as illustrated in FIGS. 1 and 2, the workpiece W passes through under the film formation units 3*a* to 3*f* and the film process unit 4.

In the film formation unit 3*a*, the sputter gas introducing unit 32 introduces the sputter gas G1, and the DC power supply 31 applies a DC voltage to the sputter source 30. Application of the DC voltage produces plasma sputter gas G1, and ions are produced. When the produced ions bombard the target 30*a*, the materials of the target 30*a* are beaten out. The beaten-out materials are deposited on the workpiece W that passes through under the film formation unit 3*a*, and a thin film is formed on the workpiece W. Film formation is also performed in the other film formation units 3*b*, 3*c*, 3*d*, 3*e*, and 3*f* by the same scheme. However, it is not always necessary that all film formation units 3 form films. As an example, a thin film of Nb is formed on the workpiece W.

As illustrated in FIG. 4, the workpiece W having the thin film formed by the film formation units 3*a* to 3*f* passes through under the film process unit 4. In the film process unit 4, an oxygen gas that is the process gas G2 is introduced in the electrode 40 from the process gas introducing unit 43, and the RF power supply 42 applies a high-frequency voltage to the electrode 40. Application of the high-frequency voltage produces plasma oxygen gas, and electrons, ions, and radicals, etc., are produced. The plasma flows to the carrier 5 that is the cathode from the opening 41 of the electrode 40 that is the anode. Ions in the plasma bombard the thin film on the workpiece W that passes through under the opening 41, and post-oxidation is performed on the thin film.

Such a formation of the thin film and a post-oxidation are repeatedly performed in accordance with the rotation of the carrier 5, and $Nb_2O_x$ is formed on the workpiece W. The workpiece W on which the desired $Nb_2O_x$ is formed is taken out to the exterior of the chamber 2 from the load-lock unit 6 together with the tray T.

(Pressure Change in Film Formation Room)

The principle why the internal pressure of the film formation room 34 changes during the above-described film formation process will be described with reference to FIGS. 6 to 10. FIGS. 6 to 10 are simplified vertical cross-sectional views illustrating the positional relation between the carrier 5 and the shielding member 33 as viewed in a direction B in FIG. 1.

Figure 6:
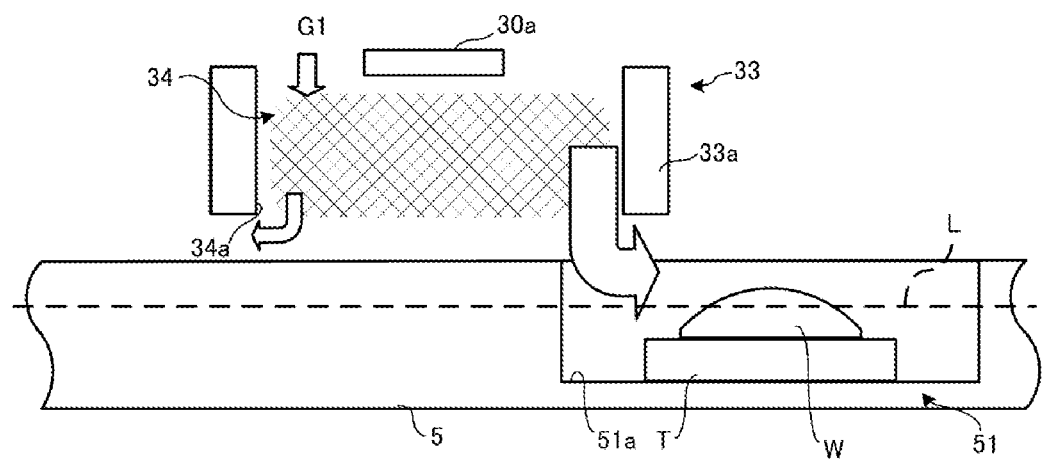
FIG. 6 is an explanatory diagram illustrating a state in which the low-pressure position is about to overlap an opening.

As illustrated in FIG. 6, in accordance with the rotation of the carrier 5, the low-pressure position 51 comes to the position where overlapping with the opening 34*a* of the film formation room 34 in a planar view starts. In this case, the gap between the upstream side (right end side in the figure) of the lower end of the shielding member 33 in the rotation direction of the carrying path L and the carrier 5 is increased by the recess 51*a*. Hence, as indicated by a white arrow in the figure, the leakage amount of the sputter gas G1 starts to increase. Accordingly, pressure reduction in the film formation room 34 starts. This causes the internal pressure of the film formation room 34 to decrease to be lower than the plasma ignition lower limit pressure.

Figure 7:
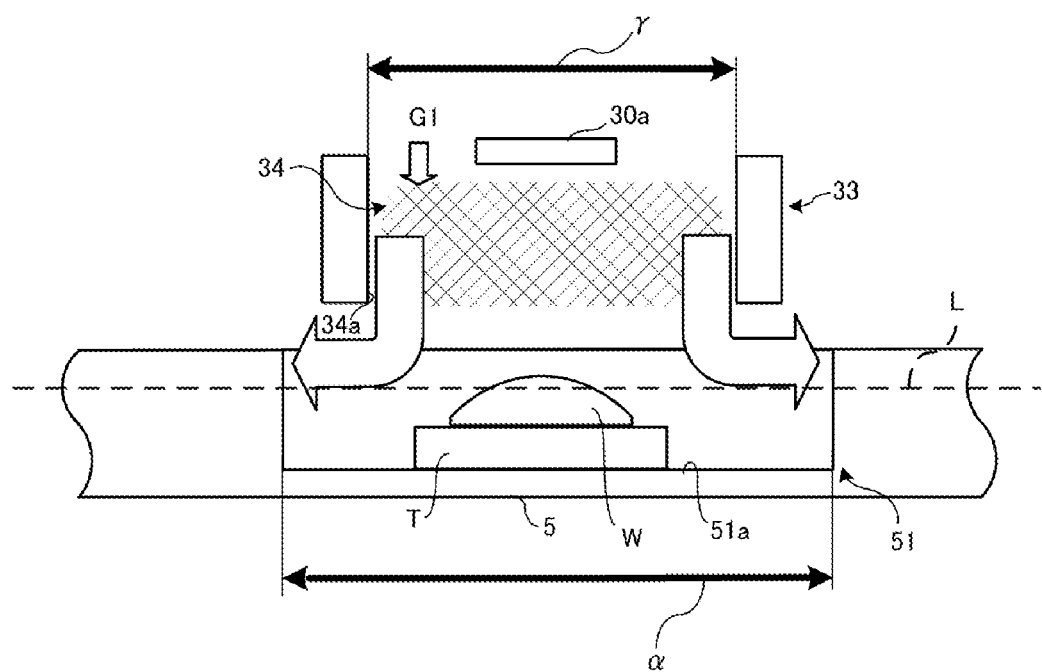
FIG. 7 is an explanatory diagram illustrating a state in which the low-pressure position comes right under the opening.

As illustrated in FIG. 7, when the low-pressure position 51 comes right under the opening 34*a* of the film formation room 34, the gap between both ends of the lower end of the shielding member 33 at the upstream side and at the downstream side in the rotation direction of the carrying path L and the carrier 5 is increased. Accordingly, as indicated by a white arrow in the figure, the leakage amount of the sputter gas G1 further increases. This is because the distance α along the carrying path L of the recess 51*a* is formed to be longer than the distance γ of the opening 34*a* along the carrying path L.

Figure 8:
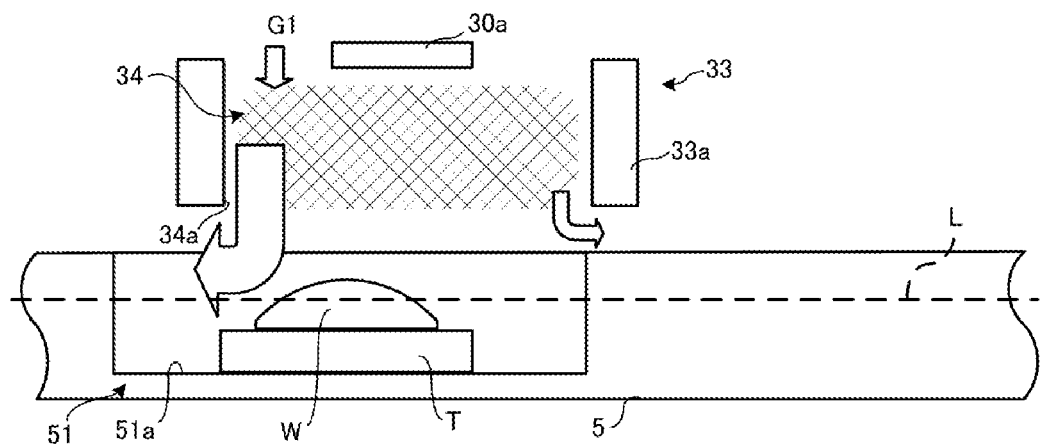
FIG. 8 is an explanatory diagram illustrating a state in which the low-pressure position is displaced from the location right below the opening.

As illustrated in FIG. 8, in accordance with the rotation of the carrier 5, the low-pressure position 51 comes to the position exceeding the position right under the opening 34*a* of the film formation room 34. In this case, the gap between the upstream side (right end side in the figure) of the lower end of the shielding member 33 in the rotation direction of the carrying path L and the carrier 5 is decreased by the recess 51*a*. Hence, as indicated by a white arrow in the figure, the leakage amount of the sputter gas G1 starts to decrease. This causes the internal pressure of the film formation room 34 to start increasing.

Figure 9:
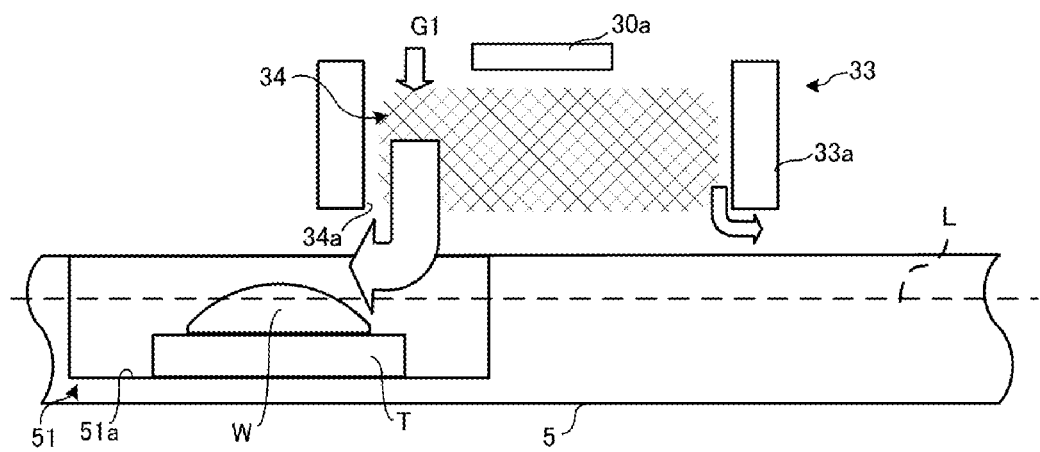
FIG. 9 is an explanatory diagram illustrating a state in which the overlap between the low-pressure position and the opening is about to be eliminated.

As illustrated in FIG. 9, in accordance with the rotation of the carrier 5, the volume of the recess 51*a* that faces the opening 34*a* decreases, and when the gap between the lower end of the shielding member 33 and the carrier 5 decreases, the internal pressure of the film formation room 34 further increases.

Figure 10:
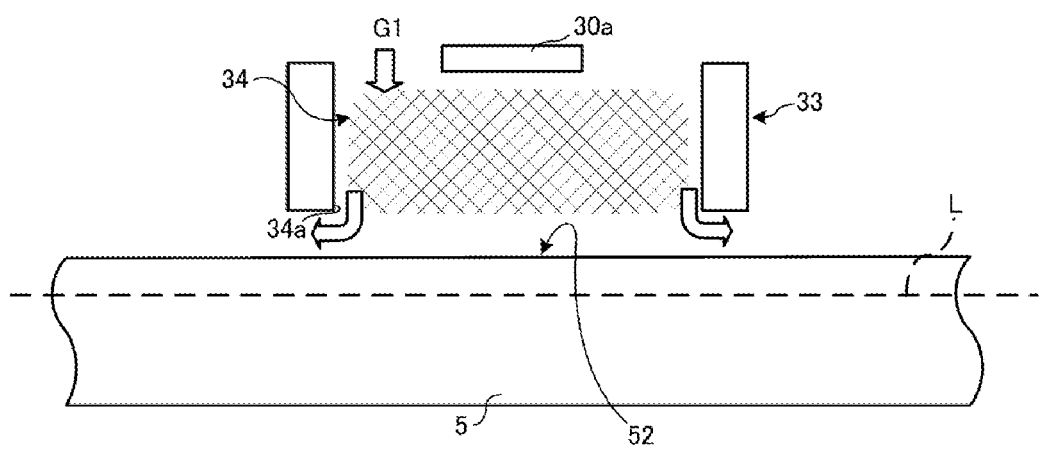
FIG. 10 is an explanatory diagram illustrating a state in which the high-pressure position comes right under the opening.

Furthermore, as illustrated in FIG. 10, in accordance with the rotation of the carrier 5, when the high-pressure position 52 comes right under the opening 34*a* of the film formation room 34, the gap between the lower end of the shielding member 33 and the carrier 5 further decreases. This causes the internal pressure of the film formation room 34 to increase to be equal to or higher than the plasma ignition lower limit pressure.

EXAMPLES

A specific example in which the above-described embodiment is applied will be described below. First, an example in which the pressure changes in the film formation room 34 during a film formation is measured will be described with reference to FIG. 11. In this example, the film formation room 34, the sputter gas G1, and the sputter source 30 that had the plasma electric discharge maintaining lower limit pressure of substantially 0.08 Pa and had the plasma ignition lower limit pressure of substantially 0.19 Pa were applied. Moreover, the low-pressure position 51 where the workpiece W was placed was provided at a single site on the carrier 5. A gap $b_1$ between the low-pressure position 51 and the dividing wall 33a was 30 mm, and a gap $b_2$ between the high-pressure position 52 and the dividing wall 33a was 5 mm (see FIG. 2 and FIG. 4).

Moreover, a conductance of the high-pressure position 52 when no film formation was performed was 522 L/s, and a conductance of the low-pressure position 51 at the time of film formation was 964 L/s (1.85 times). A resistance produced when a gas flows in a specific region will be referred to as a discharge resistance, and the inverse number thereof is the conductance. That is, the conductance indicates the easiness for a gas to flow.

Figure 11:
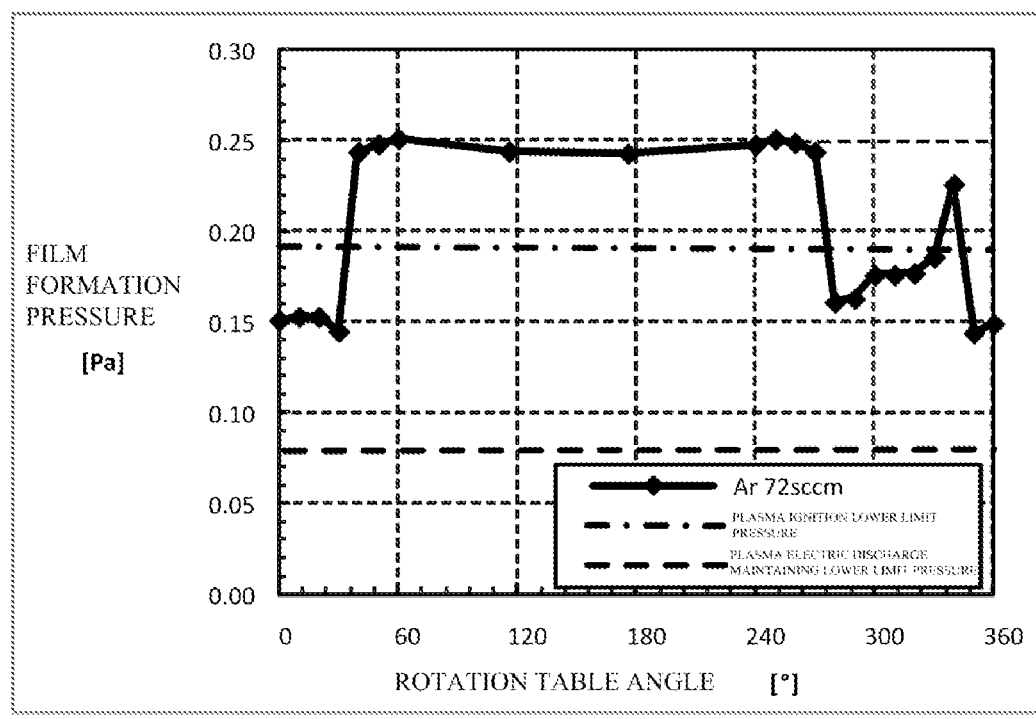
FIG. 11 is a graph illustrating an example change in the internal pressure of the film formation room.

As illustrated in FIG. 11, the film formation pressure of when an Ar gas of 72 sccm was flown in the film formation room 34 was 0.25 Pa when no film formation was performed, and 0.15 Pa at the time of film formation. Accordingly, since the electric discharge can be maintained by increasing the pressure and igniting again when no film formation is performed even when the electric discharge is lost, the film formation can be performed at the pressure less than the plasma ignition lower limit pressure.

Figure 12A:
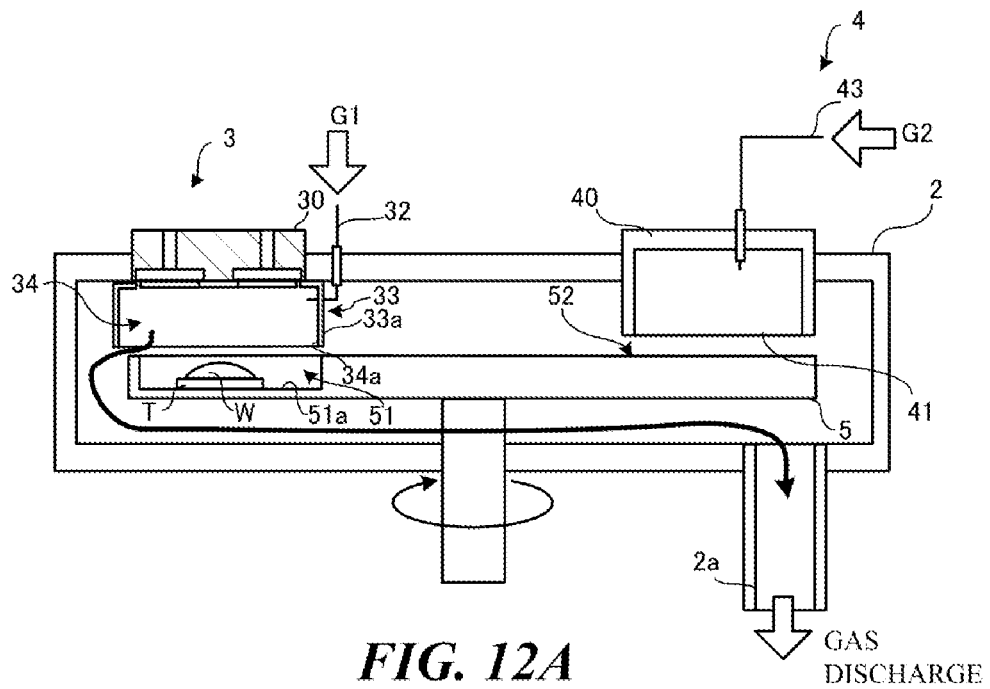
FIG. 12A is an explanatory diagram illustrating the flow of a sputter gas in the film formation apparatus, and 12B is an explanatory diagram illustrating the external dimension of a shielding member.

There are various schemes to acquire the conductance. According to the film formation apparatus 1 of this embodiment, as indicated by a thick black arrow in FIG. 12A, the sputter gas G1 passes through the gap between the shielding member 33 and the rotation table that is the carrier 5, and flows to the gas discharging unit 2a located at the bottom of the chamber 2. A conductance C1 of all the portions of the gas discharging path inside the film formation apparatus 1 can be acquired using the following formula based on an effective gas discharging speed S* and a gas discharging speed $S_0$ of a pump that is a depressurizing device.

$C1 = S* S_0 / (S_0 - S*)$

The effective gas discharging speed S* is acquired by a Q-P measurement. The Q-P measurement is a scheme of calculating the effective gas discharging speed from the measured value of a flow volume Q and a pressure P. More specifically, the value of the internal pressure of the film formation room 34 when the sputter gas G1 is flown in the film formation room 34 divided by the shielding member 33 is measured. Moreover, by dividing the value of the gas flow volume by the sputter gas introducing unit 32 by the value of the pressure, the effective gas discharging speed is acquired.

For example, it is assumed that the effective gas discharging speed at the time of film formation is 860 L/s, and the effective gas discharging speed when no film formation is performed is 490 L/s. If the pump gas discharging speed is not changed from 8000 L/s, a conductance C1x at the time of film formation is 963.585 L/s, and a conductance C1y when no film formation is performed is 521.971 L/s.

Figure 12B:
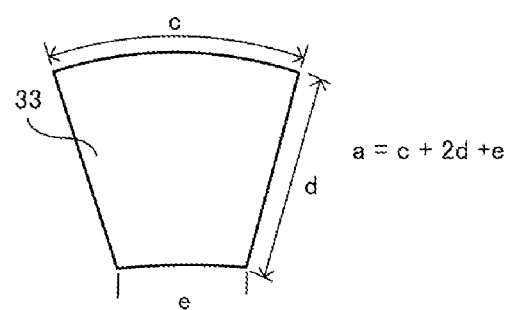

Moreover, a conductance C2 of the gap between the shielding member 33 and the rotation table that is the carrier 5 is acquired as follows. It is assumed that the gap between the shielding member 33 and the rotation table that is the carrier 5 is a thin pipe that has two parallel surfaces. As illustrated in FIG. 12B, when the shielding member 33 is viewed in a plan view, a length of the outer circumference that forms the flow path of the sputter gas G1 is a, and a length between the shielding member 33 and a rotation table is b. That is, the length b of the gap between the shielding member 33 and the rotation table becomes the gap $b_1$ at the time of film formation and becomes the gap $b_2$ when no film formation is performed (see FIG. 12A, FIG. 2, and FIG. 4). When the plate thickness of the shielding member 33 is l and a correction coefficient is K, the conductance C2 can be acquired by the following formula.

$C2 = 309 \, Kab^2/l$

When the conductance at the time of film formation is C2x, the conductance when no film formation is performed is C2y, the common parameters a and l are as follows. When the outer arc of the shielding member 33 in a plan view is c, a side substantially parallel to a radial direction is d, and an internal circumference side is e, a=c+2d+e is satisfied. When, for example, c is 487.5 mm, d is 1131 mm, and e is 0 mm for not being considered as the flow path, a=2749.5 mm is acquired. Moreover, l is 12 mm. Note that as for the c portion of the shielding member 33, depending on how the recess 51a is formed, the gap between the carrier 5 may change or may not change.

The length b of the gap and the correction coefficient K that are parameters which change depending on whether a film is formed or not are as follows. As above, the length b at the time of film formation that is the gap $b_1$ between the internal bottom surface of the low-pressure position 51 and the dividing wall 33a is 30 mm, and the length b when no film formation is performed that is the gap $b_2$ between the surface of the high-pressure position 52 and the dividing wall 33a is 5 mm. The correction coefficient K is selected from the value of l/b as appropriate. The correction coefficient K is 0.13 when $b_1$ and 0.46 when $b_2$. In this case, for example, the conductance C2x at the time of film formation is 8284 L/s and the conductance C2y when no film formation is performed is 814 L/s.

As for the conductance C2x in this calculation, the value when became the maximum is acquired. However, when the recess 51a is in a sector shape that has substantially the size equal to that of the shielding member 33, the conductance C2x acquired by the calculation becomes 8284 L/s only for a moment. In practice, the gap be of the d portion at one side becomes large, and then the large portion of the gap b eventually increases at the c portion. Next, at a time point at which the gap b becomes large throughout the entire c portion, the gap b at both d parts becomes the maximum.

Subsequently, the gap b of the d portion where the gap b initially became large becomes narrow, and the large portion of the gap b eventually decreases at the c portion. Finally, the gap b of the d portion where the gap b became large later becomes narrow. During the entire procedure, that is, during after the gap b of the forehead d portion becomes large and until the gap b of the last d portion becomes narrow, it is necessary that the internal pressure of the film formation room 34 is lower than the plasma ignition lower limit pressure. Hence, it is desirable to cause a change in the conductance C2x so that the internal pressure of the film formation room 34 becomes lower than the plasma ignition lower limit pressure only at the d portion at one side.

Meanwhile, when the gap between the shielding member 33 and the rotation table that is the carrier 5 is large, the process gas G2 of the film process unit 4 flows into the film formation unit 3. When the flow volume of the process gas G2 exceeds a certain amount, the sputtering transitions to the oxidation mode. The oxidation mode forms an oxide on the surface of the target. Transitioning to the oxidation mode decreases the film formation rate, and the productivity is decreased. Hence, when post-oxidation is to be performed, the conductance C2 should not be too large.

In this case, with reference to FIGS. 13 and 14, an example of a consideration result on the upper limit of the conductance C2x at the time of film formation relative to the conductance C2y when no film formation is performed will be described in view of the relation between the conductance C2x and the flow volume of the process gas G2. In this example, the film formation apparatus 1 with the film formation units 3 including the three targets 30a installed in the radial direction was applied. The film formation condition was the case in which an $Nb_2O_x$ film was formed. The power of the DC power supply 31 applied to the three targets 30a were 1.65, 2.08, and 3.34 [kW] from the inner circumference side to the outer circumference side. The power applied from the RF power supply 42 to the electrode 40 of the film process unit 4 was 5 [kW], the flow volume of argon gas that was the sputter gas G1 was 72 [sccm], the flow volume of oxygen that was the process gas G2 was 40 to 200 [sccm], and the rotation speed of the rotation table was 60 [rpm].

Figure 13:
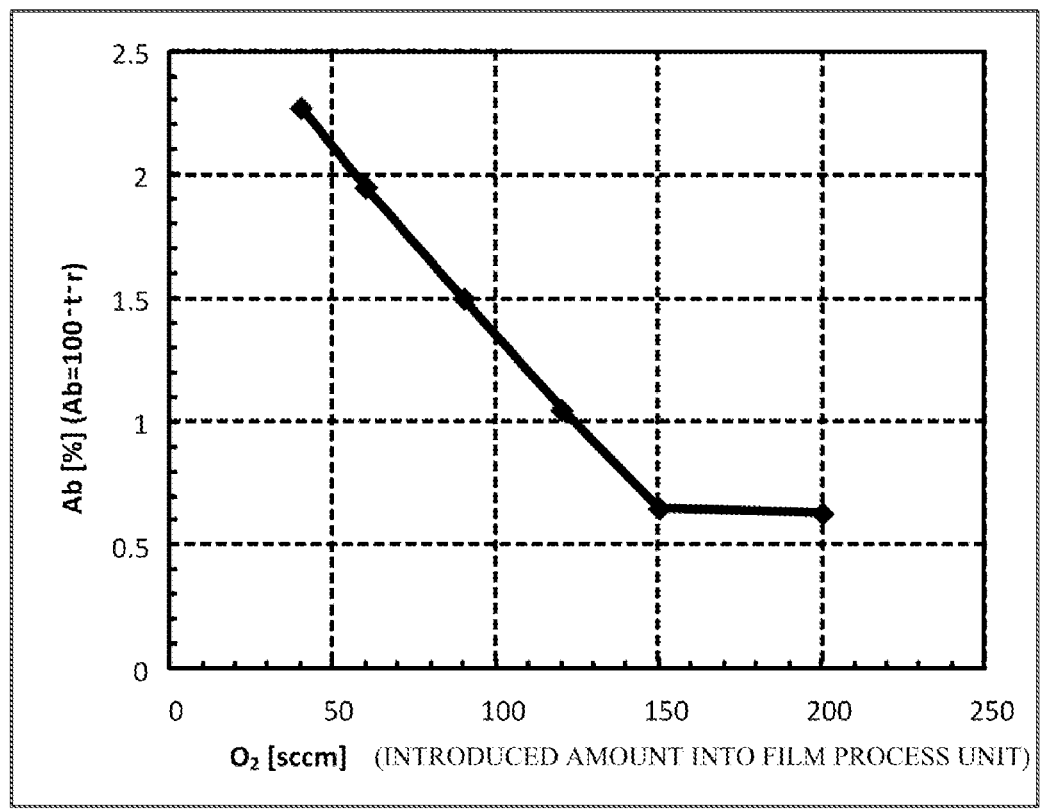
FIG. 13 is a graph illustrating a relation between the flow volume of oxygen supplied to a film process unit and the light absorption rate of an $Nb_2O_x$ film.

FIG. 13 is a graph that shows the relation between the flow volume of oxygen supplied to the film process unit 4 and a light absorption rate Ab of an $Nb_2O_x$. The absorption rate Ab is a ratio of the incident light absorbed in the substance when light enters the substance, and when a transmission rate is t and a reflection rate is r, the absorption rate can be acquired from the following formula.

$$Ab=100-t-r$$

In the case of films applied for an optical application, it is desirable that the absorption rate Ab is low. In general, when Ab≤1%, it can be competent to the optical application. As illustrated in FIG. 13, the light absorption rate Ab of the respective $Nb_2O_x$ films formed with the flow volume of oxygen being 40, 60, 90, 120, 150, and 200 sccm were acquired. As a result, the absorption rate Ab became equal to or smaller than 1% when the flow volume was equal to or greater than 150 sccm. Moreover, the absorption rate Ab when the flow volume of oxygen was 150 sccm was almost the same the absorption rate Ab when the flow volume of oxygen was 200 sccm. In view of the foregoing, it is thought that by introducing oxygen by the flow volume of equal to or greater than 150 sccm, the $Nb_2O_x$ film with the lowest absorption rate Ab may be acquirable. Accordingly, in view of the utilization efficiency of oxygen that is the process gas G2, it is preferable to set the flow volume to 150 to 200 sccm. Note that the absorption rate Ab is a value when the film thickness of $Nb_2O_x$ was 65 nm.

Figure 14:
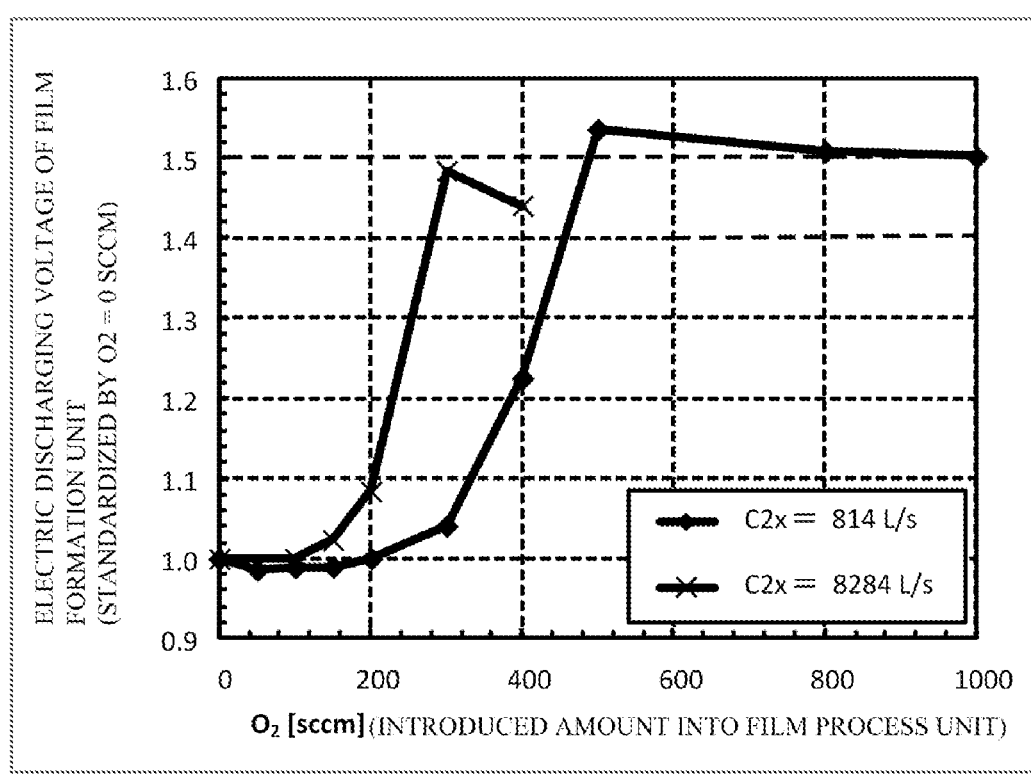
FIG. 14 is a graph illustrating the relation between the flow volume of oxygen supplied to the film process unit and an electric discharging voltage of the film formation unit.

In contrast, FIG. 14 is a graph that shows a relation between the flow volume of oxygen supplied to the film process unit 4 and the electric discharging voltage of the film formation unit 3. In this test, the gap b1 between the internal bottom surface of the low-pressure position 51 and the dividing wall 33a was set to 5 mm (the maximum value of C2x was 814 L/s, that is, same as C2y), and 30 mm (the maximum value of C2x was 8284 L/s). The substance Nb increases the electric discharging voltage when the sputtering becomes the oxidation mode. Accordingly, how the electric discharging voltage of the film formation unit 3 changes relative to the flow volume of the oxygen supplied to the film process unit 4 when the gap b1 was set as the above two cases was checked.

As illustrated in FIG. 14, in the case of C2x=814 L/s, when the flow volume of oxygen is increased, the electric discharging voltage keenly increases near the flow volume of oxygen of 300 sccm. In view of the foregoing, it is thought that the sputtering transitions to the oxidation mode near the flow volume of oxygen of 300 sccm. Hence, in this case, it is preferable to set the flow volume of oxygen to be equal to or smaller than 300 sccm. In this case, as described above, in order to decrease the absorption rate Ab, it is preferable to set the flow volume of oxygen to be 150 to 200 sccm. That is, in the case of C2x=814 L/s, there is no problem in practice to set the flow volume of oxygen to 200 sccm.

In the case of C2x=8284 L/s, when the flow volume of oxygen is increased, the electric discharging voltage keenly increases when the flow volume exceeds 150 sccm. In view of the foregoing, it is thought that the sputtering is transitioned to the oxidation mode when the flow volume of oxygen exceeds 150 sccm. Hence, in this case, it is preferable to set the flow volume of oxygen to be equal to or smaller than 150 sccm. Meanwhile, as described above, in order to decrease the absorption rate Ab, it is preferable to set the flow volume of oxygen to 150 to 200 sccm. Accordingly, when C2x=8284 L/s, the flow volume of oxygen is 150 sccm.

In view of the above-described results, when C2x>8284 L/s, it is thought that the sputtering transitions to the oxidation mode at a stage at which the flow volume of oxygen is less than 150 sccm. Since the flow volume of oxygen which is equal to or greater than 150 sccm is necessary to decrease the absorption rate Ab, C2x=8284 L/s becomes the upper limit for C2y=814 L/s. In this case, C2x/C2y=10.18. Accordingly, it is preferable to set C2x to exceed 1.0 time and to be equal to or smaller than 10.0 times relative to C2y.

Figure 15:
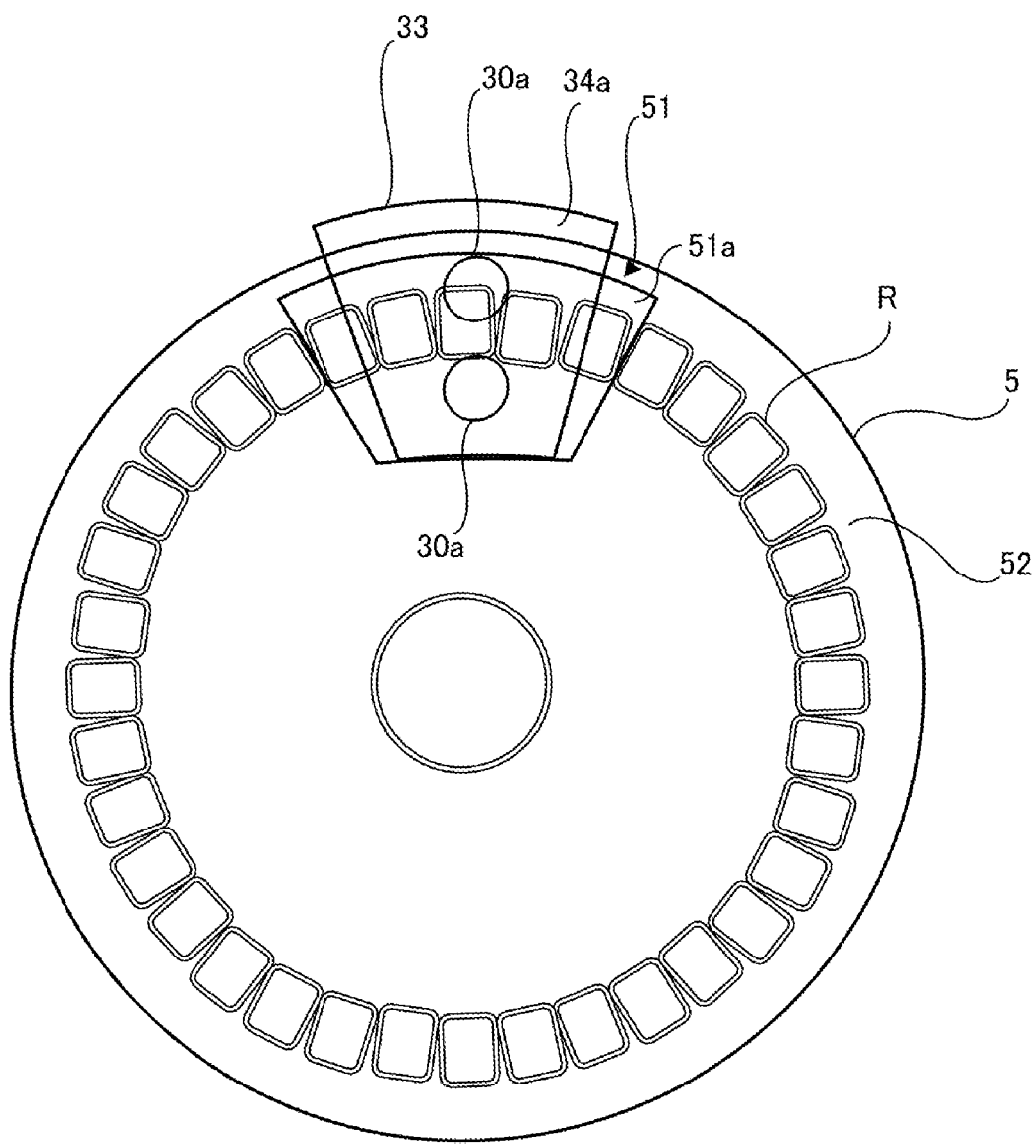
FIG. 15 is an explanatory diagram illustrating a chip layout of a test forming films on a plurality of chips.

Moreover, a test that indicates the improvement of a denseness by forming a film at the low-pressure position 51 will be described with reference to FIG. 15 and FIG. 16. FIG. 15 is a plan view illustrating an example structure of the carrier 5 when the test was made. The recess 51a was provided at a single site on the rotation table that was the carrier 5. 36 chips of a silicon wafer (hereinafter, referred to as a chip R) was set on the rotation table at 10-degree pitch. In this condition, a silicon oxide film ($SiO_2$) was formed.

Figure 16:
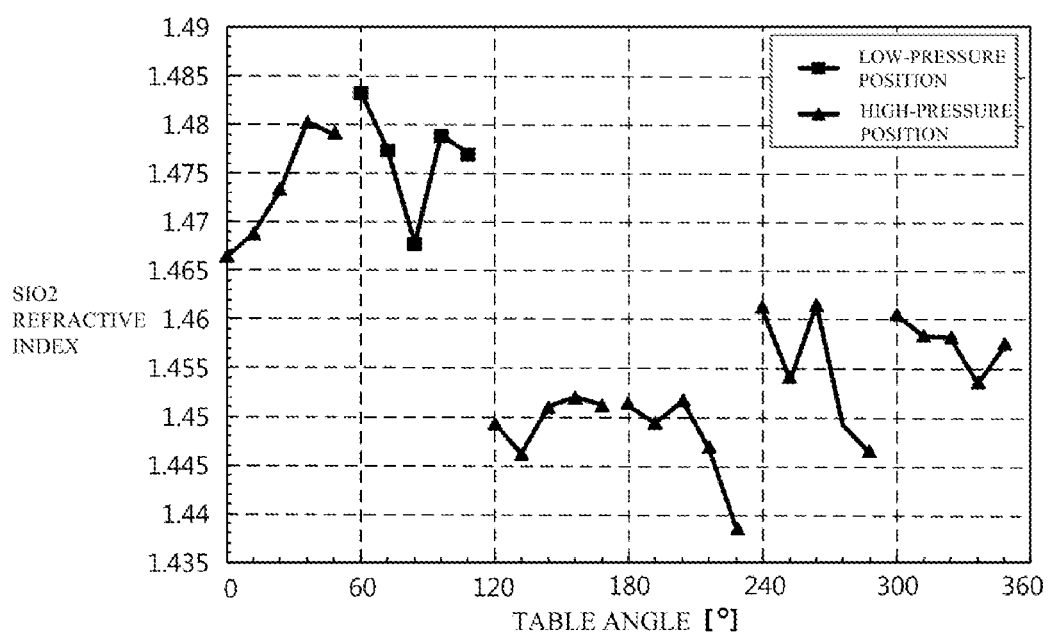
FIG. 16 is a graph illustrating the test result of FIG. 13 as a refractive rate of a film.

FIG. 16 shows a test result of checking the refractive index of the $SiO_2$ film formed on each chip R. The reason why the refractive index was adopted is because, in general, the refractive index of the film increases when the denseness of a formed film increases. Based on this test result, it becomes clear that the refractive index of the $SiO_2$ film formed on the chip R set at the low-pressure position 51, that is, the recess 51a, increases in comparison with the other chips R. In view of the foregoing, it is thought that film forming pressure is in a low pressure. Moreover, the chip R located at the position adjacent to the recess 51a also had the refractive index increased, it is assumed that said chip R is effected by the pressure reduction at the recess 51a.

[Action and Effect]

(1) As described above, the film formation apparatus 1 according to this embodiment includes the film formation unit 3 which includes the film formation room 34 that has the opening 34a at one end, and the target 30a formed of a film formation material in the film formation room 34, and which deposits the film formation material of the target 30a on a surface of the workpiece W facing the opening 34a by plasma produced by the sputter gas G1 in the film formation room 34, the carrier 5 that carries the workpiece W along the predetermined carrying path L so that the workpiece W repeatedly pass through the facing region which faces the opening 34a of the film formation room 34 and the non-facing region which does not face the opening 34a of the film formation room 34. The carrier 5 includes the low-pressure position 51 where the workpiece W is placed and which causes the interior of the film formation room 34 to be lower than the plasma ignition lower limit pressure and to be equal to or higher than the plasma electric discharge maintaining lower limit pressure when passing through the facing region, and the high-pressure position 52 where workpiece W is not placed and which causes the interior of the film formation room 34 to be equal to or higher than the plasma ignition lower limit pressure when passing through the facing region.

Accordingly, when the workpiece W placed on the low-pressure position 51 passes through the facing region which faces the opening 34a of the film formation room 34, and a film forming is performed, the interior of the film formation room 34 becomes a low pressure that is lower than the plasma ignition lower limit pressure. This forms a dense film. At this time, since the plasma electric discharge maintaining lower limit pressure is maintained in the film formation room 34, a possibility that plasma is dissipated is reduced. Moreover, even if the plasma is dissipated, since the interior of the film formation room 34 becomes equal to or higher than the plasma ignition lower limit pressure when the high-pressure position 52 passes through the facing region which faces the opening 34a, the plasma can be produced again.

Since the reduced pressure densifies the film, the film thickness distribution can be made uniform without making a distance between the target 30a and the workpiece W too small. In particular, even if the plurality of targets 30a are simultaneously subjected to sputtering to form films, by adopting an appropriate distance between the target 30a the workpiece W, the film thickness distribution can be made uniform.

(2) The distance H1 between the facing surface of the low-pressure position 51 which faces the opening 34a and the target 30a is longer than the distance H2 between the facing surface of the high-pressure position 52 which faces the opening 34a and the target 30a.

Accordingly, when the low-pressure position 51 passes through the facing region, the region that surrounds the circumference of the workpiece W at the time of film formation increases, and the pressure thereof becomes low. Moreover, when the high-pressure position 52 passes through the facing region, the region that surrounds the circumference of the workpiece W decreases, and the high pressure is maintained.

(3) The distance α of the low-pressure position 51 in the direction along the carrying path L and the distance β of the high-pressure position 52 in the direction along the carrying path L are both equal to or longer than the distance γ of the opening 34a in the direction along the carrying path L.

Accordingly, since the sputter gas G1 easily flows out from the opening 34a at the low-pressure position 51, the pressure becomes a low pressure. Moreover, since the sputter gas G1 is not easily flown out from the opening 34a at the high-pressure position 52, the pressure becomes a high pressure.

(4) The low-pressure position 51 includes the recess 51a on which the workpiece W is placed. Formation of the recess 51a facilitates a formation of the low-pressure position 51.

(5) The conductance between the low-pressure position 51 and the opening 34a is greater than the conductance between the high-pressure position 52 and the opening 34a. At the low-pressure position 51, the sputter gas G1 easily flows out, causing the pressure to be a low pressure.

(6) The carrier 5 is a rotation table that circulates and carries the workpiece W on the circumferential trajectory, and the opening 34a and the low-pressure position 51 are each in a substantially sector shape. Hence, since the side edges of the low-pressure position 51 and the facing region of the opening 34a are straight when the low-pressure position 51 passes through the facing region of the opening 34a, the pressure change in the film formation room 34 is performed promptly.

(7) The film formation apparatus further includes the film process unit 4 that combines a substance with the film formed on the workpiece W by the film formation unit 3 at the region where the low-pressure position 51 and the high-pressure position 52 face to perform a process of producing a compound film. The conductance between the low-pressure position 51 and the opening 34a exceeds 1.0 and is equal to or smaller than 10.0 times relative to the conductance between the high-pressure position 52 and the opening 34a. Hence, the pressure at the time of film formation in the low-pressure position 51 is reduced, and the conductance is suppressed to prevent a chemical combination at the time of film formation by the flowing around and flowing in of the substances, such as oxygen or nitrogen, from the film process unit 4 to be combined.

(8) When the internal pressure of the film formation room 34 when the low-pressure position 51 passes through the facing region is P1, the distance between the facing surface of the low-pressure position 51 which faces the opening 34a and the target 30a is H1, the internal pressure of the film formation room 34 when the high-pressure position 52 passes through the facing region is P2, and the distance between the facing surface of the high-pressure position 52 which faces the opening 34a and the target 30a is H2, $P1 \times H1 \leq P2 \times H2$ is satisfied. Hence, the distance H1 to the target 30a can be the distance that can maintain the effect of densifying the film by a low pressure while making the film thickness distribution uniform.

Modified Example

The embodiment of the present disclosure is not limited to the above-described embodiment, and also covers the following aspects. Note that the detailed description on the similar structure to the above-described embodiment will be omitted.

(1) The distance between the facing surface of the low-pressure position 51 which faces the opening 34a and the target 30a may be designed as changeable. For example, since the volume of the recess 51a can be changed by providing the internal bottom surface of the recess 51a movable up and down, the pressure is adjustable. Moreover, the volume of the recess 51a can be also changed by adjusting the number of trays T placed on the low-pressure position 51. The pressure adjustment becomes simple when the pressure is adjusted by the number of trays T. That is, the workpiece W may be placed on the low-pressure position 51 via the single tray T or the plurality of the trays T.

(2) The sputter gas introducing unit 32 may supply the sputter gas G1 in the film formation room 34 so that the internal pressure of the film formation room 34 becomes equal to or higher than the plasma electric discharge maintaining lower limit pressure and becomes lower than the plasma ignition lower limit pressure when the low-pressure position 51 passes through the facing region, and the internal pressure of the film formation room 34 becomes equal to or higher than the plasma ignition lower limit pressure when the high-pressure position 52 passes through the facing region.

That is, as described above, the shape of the low-pressure position 51 and that of the high-pressure position 52 is made different. Next, the supply amount of the sputter gas G1 of when the low-pressure position 51 passes through the facing region and when the high-pressure position 52 passes through the facing region is changed. The pressure difference may be achieved by this scheme. Alternatively, the supply amount of the sputter gas G1 of when the above-described respective positions pass through the facing region is changed without making a difference between the shape of the low-pressure position 51 and that of the high-pressure position 52. The pressure difference may be achieved by this scheme.

(3) The shape of the low-pressure position 51 is not limited to a sector shape. Various shapes are applicable in accordance with the shape and numbers, etc., of the workpiece W to be placed. For example, a circular shape, an elliptical shape, a triangular shape, a rectangular shape, a polygonal shape such as a trapezoidal shape are applicable.

(4) Although the embodiment of the present disclosure and the modified example of each component have been described above, those embodiment and modified example are merely presented as examples, and are not intended to limit the scope of the present disclosure. The above-described novel embodiment can be carried out in other various forms, and various omissions, replacements, and modifications can be made thereto without departing from the scope of the present disclosure. Such embodiment and modified form thereof are within the scope of the present disclosure, and also within the scope of the invention as recited in the appended claims. The invention as recited in each claim can be freely combined, and the features of the above-described embodiment and modified examples (1), (2) may be selectively combined or omitted as appropriate.

What is claimed is:

1. A film formation apparatus comprising:
    a container which has an interior capable of maintaining a vacuumed condition;
    a film formation unit that comprises a film formation room provided in the container and having an opening at one end, has a target formed of a film formation material in the film formation room, and deposits the film formation material of the target on a surface of a workpiece facing the opening by plasma produced by a sputter gas in the film formation room; and
    a carrier that carries the workpiece along a predetermined carrying path so that the workpiece repeatedly passes through a facing region which faces the opening of the film formation room and a non-facing region which does not face the opening of the film formation room,
    wherein the carrier comprises:
        a low-pressure position comprises a recess on which the workpiece is placed;
        an internal bottom surface of the recess comprises a part where the workpiece is placed and a part where the workpiece is not placed;
        a high-pressure position comprises a flat facing surface closer to the opening than the internal bottom surface of the recess;
        a distance between the part where the workpiece is not placed and the target is longer than a distance between the flat facing surface of the high-pressure position and the target;
        the low-pressure position causes the interior of the film formation room to be lower than a plasma ignition lower limit pressure and to be equal to or higher than a plasma electric discharge maintaining lower limit pressure when passing through the facing region; and
        the high-pressure position causes the interior of the film formation room to be equal to or higher than the plasma ignition lower limit pressure when passing through the facing region.

2. The film formation apparatus according to claim 1, wherein a distance of the low-pressure position in a direction along the carrying path and a distance of the high-pressure position in the direction along the carrying path are each equal to or longer than a distance of the opening in the direction along the carrying path.

3. The film formation apparatus according to claim 1, wherein a gas flow conductance between the low-pressure position and the opening is greater than gas flow conductance between the high-pressure position and the opening.

4. The film formation apparatus according to claim 1, wherein:
    the carrier is a rotation table that circulates and carries the workpiece on a circumferential trajectory; and
    the opening and the low-pressure position are each in a substantially sector shape.

5. The film formation apparatus according to claim 1, further comprising a film process unit that combines a substance with the film formed on the workpiece by the film formation unit at a region where the low-pressure position and the high-pressure position face to perform a process of producing a compound film,
    wherein the gas flow conductance between the low-pressure position and the opening exceeds 1.0 and is equal to or smaller than 10.0 times relative to the gas flow conductance between the high-pressure position and the opening.

6. The film formation apparatus according to claim 1, wherein when an internal pressure of the film formation room when the low-pressure position passes through the facing region is P1, a distance between the facing surface of the low-pressure position which faces the opening and the target is H1, an internal pressure of the film formation room when the high-pressure position passes through the facing region is P2, and a distance between the facing surface of the high-pressure position which faces the opening and the target is H2, $P1 \times H1 \le P2 \times H2$ is satisfied.

7. The film formation apparatus according to claim 1, wherein a distance between the facing surface of the low-pressure position which faces the opening and the target is changeable.

8. The film formation apparatus according to claim 1, wherein the low-pressure position further comprises a single tray or a plurality of trays.

9. The film formation apparatus according to claim 1, further comprising a gas supply unit that supplies the sputter gas in the film formation room so that an internal pressure of the film formation room becomes equal to or higher than a plasma electric discharge maintaining lower limit pressure and becomes lower than a plasma ignition lower limit pressure when the low-pressure position passes through the facing region, and the internal pressure of the film formation room becomes equal to or higher than the plasma ignition lower limit pressure when the high-pressure position passes through the facing region.

* * * * *